United States Patent [19]

Joseph

[11] Patent Number: 4,521,697

[45] Date of Patent: Jun. 4, 1985

[54] PNP COMPARATOR CIRCUIT HAVING BETA CURRENT ERROR CANCELLATION

[75] Inventor: Eric D. Joseph, Mesa, Ariz.

[73] Assignee: Motorola, Inc., Schaumburg, Ill.

[21] Appl. No.: 453,389

[22] Filed: Dec. 27, 1982

[51] Int. Cl.$^3$ .................. H03K 5/153; H03K 5/24; H03K 17/72

[52] U.S. Cl. .................... 307/355; 307/362; 307/491; 330/257; 330/288

[58] Field of Search ........... 307/355, 358, 362, 491, 307/494, 350, 354, 356; 330/257, 261, 288

[56] References Cited

U.S. PATENT DOCUMENTS 4,418,290 11/1983 Nagano ........................ 307/355

Primary Examiner—Stanley D. Miller
Assistant Examiner—Timothy P. Callahan
Attorney, Agent, or Firm—Michael D. Bingham

[57] ABSTRACT

A comparator circuit comprising a pair of PNP input transistors having their collector-emitter paths coupled between first and second conductors. The output of the comparator is coupled to the base of a PNP transistor. The inputs of the comparator are coupled to the bases of the pair of PNP transistors and receive differential input signals thereat. A resistive element is connected between the input and base of one of the pair of transistors to produce an offset voltage which cancels any offset voltage produced at the input of the comparator caused by an error current that flows through the other one of the pair of transistors. The error current is due to base current flow from the PNP transistor that is connected to the output of the comparator.

8 Claims, 1 Drawing Figure

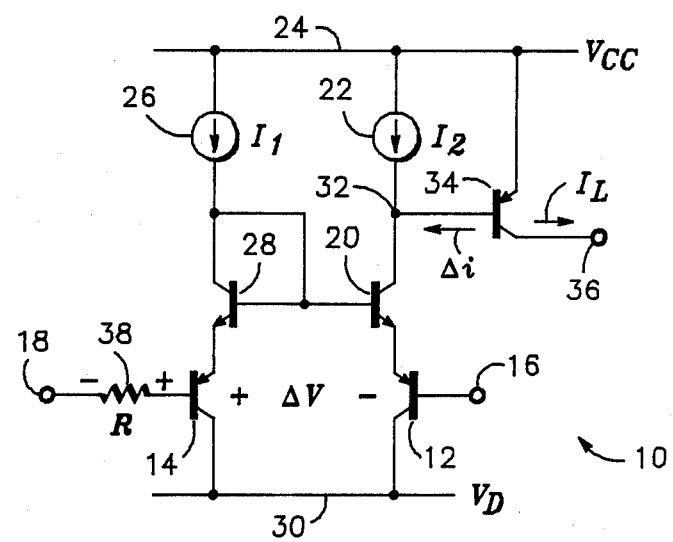

PNP COMPARATOR CIRCUIT HAVING BETA CURRENT ERROR CANCELLATION

BACKGROUND OF THE INVENTION

The present invention relates to integrated comparator circuits and, more particularly, to such comparators comprising a pair of input transistors adapted to receive a differential input signal for driving a current source transistor of same conductivity type which has its base coupled to an output of the comparator. More particularly, the subject invention is concerned with eliminating or severely reducing any offset voltage that is introduced by the loading effect of the current source transistor.

PNP comparator circuits which are operated from a single power supply are well known in the art. A problem occurs if a PNP comparator must be operated from a single power supply to provide an output signal to drive a current sourcing PNP transistor at the output of the comparator. For example, one such use for a PNP comparator is in an overvoltage sensing circuit wherein one input to the comparator is connected to a fixed reference potential while the other input is coupled to a voltage to be sensed. It may be desirable to switch the conduction state of the comparator at a particular value of the sensed voltage. The aforementioned problem arises due to the base current flowing from the PNP current source transistor into the output of comparator. Since the forward current gain factor, beta, of the PNP transistors is typically small for PNP transistors fabricated in monolithic form, the base current produces a loading effect on the comparator which reflects onto the input thereof as an offset voltage. This offset voltage offsets the balanced switching point of the comparator which may be undesirable.

Thus, there is a need for canceling the effects of the base current error into the output of the comparator described above.

SUMMARY OF THE INVENTION

Accordingly, it is an object of the present invention to provide an improved precision comparator circuit.

Another object of the present invention is to provide an improved integrated comparator circuit.

Still another object is to provide an improved integrated comparator circuit which drives a current source transistor of same conductivity type.

A further object of the present invention is to provide an integrated comparator circuit having base current error correction.

In accordance with the above and other objects there is provided a comparator circuit comprising a pair of input transistors of a first conductivity type each having a control electrode coupled to respective input of the comparator circuit, first electrodes coupled respectively to a source of operating potential and second electrodes coupled respectively to a reference node; a third transistor of said first conductivity type having a control electrode coupled to the first electrode of one of said pair of input transistors, a first electrode coupled to the source of operating potential and a second electrode coupled to an utilization circuit.

BRIEF DESCRIPTION OF THE DRAWING

The single FIGURE is a schematic diagram illustrating the prepared embodiment of the present invention.

DETAIL DESCRIPTION OF THE PREFERRED EMBODIMENT

Turning to the sole FIGURE there is shown PNP comparator 10 having current error cancellation according to the preferred embodiment. It is recognized that comparator 10 is suitable to be manufactured in integrated circuit form. Comparator 10 comprises a pair of differential PNP transistors 12 and 14 each having a base or control electrode coupled to input 16 and 18, respectively, of the comparator. The emitter or first electrode of transistor 12 is coupled via the collector-emitter path of NPN transistor 20 and current source 22 to a first conductor 24 to which a source of operating potential $V_{cc}$ is supplied. The base of transistor 20 is connected to current source 26 which in turn is returned to conductor 24. The emitter of transistor 14 is coupled through diode connected transistor 28 to current source 26. The collectors or second electrodes of transistors 12 and 14 are coupled to a second conductor 30 to which, for example, a reference potential may be supplied. The output of comparator 10 may be taken at node 32 and is connected to the base of PNP current sourcing transistor 34 which may be included as an output of the comparator. The emitter of transistor 34 is coupled to conductor 24. The collector of transistor 34 is connected at output 36 to a load utilization circuit (not shown). When rendered conductive, transistor 34 sources current to output 36. As one example, the load utilization circuit may be an amplifier having an input coupled to node 36.

Current sources 22 and 26 are illustrated as supplying currents $I_1$ and $I_2$ which may or may not be of equal value. These current sources may be formed by PNP transistors as is understood such that the current sources track over temperature with transistors, 12, 14 and 34. This is important in that, by having currents $I_1$ and $I_2$ tracking current variations through the aforementioned transistor, the current error cancellation technique of the present invention can be made independent of any temperature variations.

Transistors 20 and 28 are connected between transistors 12 and 14 to the base of transistor 34 to shift the voltage level therebetween as is understood.

Ideally, transistors 12 and 14 are matched to reduce any offset voltage such that the comparator will switch states whenever the voltages applied to terminals 16 and 18 are equal: the balanced switching point of the comparator. For example, if the voltage at input 18 is greater than the voltage appearing at input 16, transistor 12 is conducting which renders transistor 34 conductive to source the current $I_L$ to terminal 36. Likewise if the voltage at input 18 beomes less than the voltage at input 16, comparator 10 switches states wherein transistor 14 becomes conductive and transistor 34 is non-conducting. If there was no error current, by matching devices, the trip point or switching point of comparator 10 would occur when the voltages on the bases of transistors 12 and 14 are equal.

However, due to transistor 34 an error current $\Delta i$ is produced the magnitude of which is a function of the beta of the transistor. Thus, transistor 34 has a loading effect on comparator 10 which is reflected onto the input of the comparator as an offset voltage. Hence, transistor 12 has a current flowing therethrough equal to the sum of $I_2$ and $\Delta i$. Since the currents through transistors 12 and 14 are not equal the offset voltage takes on a polarity as shown by $\Delta v$.

For illustration purposes, if input 18 is coupled to a fixed reference potential, the potential appearing at input 16 would have to become less positive (decrease to a lower value) due to the error current Δi. However, by adding the resistor 38 between the base of transistor 14 and input 18 an offset voltage of the polarity shown is established which cancels the offset voltage developed by error current Δi, i.e., the loading effects of transistor 34 are eliminated and can be made independent of temperature if the currents are made to have the correct temperature coefficients. In particular, if $I_L \alpha I_1 \alpha I_2$ and $\beta_{12}=\beta_{14}=\beta_{34}$, it can be shown that $R \alpha$ gm: where gm is the comparator transconductance. Cancellation over temperature is achieved by using current sources of the form $$I \alpha (kT/qR^*)$$

where $R^*$ is a resistor of the same type as R.

Hence, what has been described is a novel PNP comparator circuit having means for producing a countering offset voltage to the offset voltage generated due to a error current sourced to one of the pair of PNP input transistors of the comparator.

I claim:

1. A comparator circuit having first and second inputs and an output, comprising:
   first and second conductors;
   first and second transistors of a first conductivity type each having first and second electrodes and a control electrode; said first electrodes being coupled to said first conductor, said second electrodes being coupled to said second conductor, said control electrodes being coupled respectively to the first and second inputs of the comparator;
   a third transistor of said first conductivity type having first and second electrodes and a control electrode, said first electrode being coupled to said first conductor, said second electrode being coupled to the output of the comparator circuit, said control electrode being coupled to said first electrode of said first transistor; and
   resistive means coupled between said the second input of the comparator circuit and said control electrode of said second transistor wherein any offset voltage produced due to error current flowing from said third transistor into said first transistor is cancelled.

2. The comparator circuit of claim 1 including voltage level shifting means coupled between said first electrodes of said first and second transistors and said control electrode of said third transistor for shifting the voltage level therebetween.

3. A comparator circuit having first and second inputs and an output, comprising:
   first and second conductors;
   first and second transistors of a first conductivity type each having first and second electrodes and a control electrode; said second electrodes being coupled to said second conductor, said control electrode of said first transistor being coupled to the first input of the comparator circuit;
   a third transistor of said first conductivity type having first, second and control electrodes, said first electrode being coupled to said first conductor, said second electrode being coupled to the output of the comparator circuit;
   voltage level shifting means for shifting the voltage level between said first electrodes of said first and second transistor and said control electrode of said third transistor;
   resistive means coupled between the second input of the comparator circuit and said control electrode of said second transistor wherein any offset voltage produced due to error current flowing from said third transistor into said first transistor is cancelled;
   said voltage level shifting means including:
   (a) diode means coupled between said first electrode of said second transistor and said first conductor; and
   (b) a fourth transistor of a second conductivity type having first and second electrodes and a control electrode, said first electrode being coupled to said first electrode of said first transistor, said second electrode being coupled to said control electrode of said third transistor and to said first conductor and said control electrode being coupled with said diode means to said first conductor.

4. The comparator circuit of claim 3 including:
   first current source means connected between said first conductor and said second electrode of said fourth transistor for sourcing a substantially constant current thereto; and
   second current source means connected between said first conductor and said diode means and to said control electrode of said fourth transistor for sourcing current thereto.

5. In a monolithic integrated circuit including a PNP current source transistor having an emitter coupled to a first conductor at which is supplied a source of operating potential, a collector coupled to a load and a base, a comparator circuit, comprising:
   first and second PNP transistors each having an emitter, a collector and base, said collectors being coupled to a common conductor, said base of said first transistor being coupled to a first input of the comparator at which is applied a first input signal;
   circuit means coupled between the first conductor and said emitters of said first and second PNP transistors and to the base of the PNP current source transistor for shifting the voltage level between said emitters of said first and second PNP transistors and the base of the PNP current source transistor; and
   resistive means coupled between said base of said second PNP transistor and a second input of the comparator at which is supplied a second input signal, said resistive means producing an offset voltage that cancels any offset voltage produced by any error current flowing from the base of the PNP current source transistor through said first PNP transistor.

6. The circuit of claim 5 wherein said circuit means includes:
   a first NPN transistor having an emitter coupled to said emitter of said first PNP transistor, a collector coupled to base of the PNP current source transistor, and a base; and
   diode means coupled between said base of said first NPN transistor and said emitter of said second PNP transistor.

7. The circuit of claim 6 including:
   a first current source connected between the first conductor and said collector of said first NPN transistor; and a second current source connected between the first conductor and said base of said first NPN transistor.

8. The circuit of claim 7 wherein said diode means is a second NPN transistor having the base and collector interconnected to said base of said first NPN transistor and an emitter connected to said emitter of said second PNP transistor.

* * * * *